(12) United States Patent
Weirick et al.

(10) Patent No.: US 12,031,553 B2
(45) Date of Patent: Jul. 9, 2024

(54) ELECTRONIC DEVICE AND COOLING DEVICE WITH FAN BLADE AND RELATED METHOD

(71) Applicant: L3Harris Technologies, Inc., Melbourne, FL (US)

(72) Inventors: Charles Weirick, Melbourne, FL (US); Voi Nguyen, Oviedo, FL (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 349 days.

(21) Appl. No.: 17/650,092

(22) Filed: Feb. 7, 2022

(65) Prior Publication Data
US 2023/0254965 A1 Aug. 10, 2023

(51) Int. Cl.
| | |
|---|---|
| F04D 33/00 | (2006.01) |
| H05K 1/02 | (2006.01) |
| F28F 13/10 | (2006.01) |
| H01F 7/02 | (2006.01) |
| H01F 7/06 | (2006.01) |
| H01F 7/126 | (2006.01) |
| H01F 7/13 | (2006.01) |
| H01F 41/02 | (2006.01) |
| H05K 7/20 | (2006.01) |

(52) U.S. Cl.
CPC ........... *F04D 33/00* (2013.01); *H05K 1/0209* (2013.01); *F28F 13/10* (2013.01); *H01F 7/0273* (2013.01); *H01F 7/06* (2013.01); *H01F 2007/068* (2013.01); *H01F 7/126* (2013.01); *H01F 7/13* (2013.01); *H01F 41/0253* (2013.01); *H05K 7/20172* (2013.01); *H05K 2201/08* (2013.01)

(58) Field of Classification Search
CPC ............... F04D 33/00; H05K 2201/08; H05K 7/20172; H05K 1/0209; H01F 7/0273; H01F 7/126; H01F 7/13; H01F 7/06; H01F 2007/068; F28F 13/10
See application file for complete search history.

(56) References Cited

U.S. PATENT DOCUMENTS

| | | | | |
|---|---|---|---|---|
| 4,063,826 A | * | 12/1977 | Riepe ...................... | F04D 33/00 417/436 |
| 7,321,184 B2 | * | 1/2008 | Lee ..................... | H05K 7/20172 310/341 |
| 7,334,630 B2 | | 2/2008 | Goodson et al. | |

(Continued)

OTHER PUBLICATIONS

Giri L Agrawal "Foil Air/Gas Bearing Technology-An Overview" Presented at the International Gas Turbine & Aeroengine Congress & Exhibition: Orlando, Florida; Jun. 2-Jun. 5, 1997 pp. 11.

*Primary Examiner* — Devon Russell
(74) *Attorney, Agent, or Firm* — ALLEN, DYER, DOPPELT, + GILCHRIST, P.A. Attorneys at Law

(57) ABSTRACT

An electronic device may include an electronic circuit, a heat sink thermally coupled to the electronic circuit, and spaced apart cooling fins extending from the heat sink. Each cooling fin includes a circuit board and a cooling device mounted thereon. The cooling device may have a conductive trace layer on the circuit board defining an electromagnet, a mounting member extending upwardly from the circuit board, a fan blade coupled to an upper end of the mounting member to be movable in a rocking motion about an axis defined by the mounting member, and a permanent magnet carried by the fan blade and responsive to the electromagnet.

30 Claims, 19 Drawing Sheets

(56) References Cited

U.S. PATENT DOCUMENTS

| | | | |
|---|---|---|---|
| 7,420,807 B2 | 9/2008 | Mikubo et al. | |
| 8,988,881 B2 | 3/2015 | Koplow | |
| 10,957,620 B2 | 3/2021 | Chung et al. | |
| 11,043,444 B2 | 6/2021 | Ganti et al. | |
| 11,503,742 B2 * | 11/2022 | Mukundan | H05K 7/20254 |
| 2003/0222341 A1 | 12/2003 | Oberhardt et al. | |
| 2005/0168947 A1 | 8/2005 | Mok et al. | |
| 2011/0063800 A1 * | 3/2011 | Park | H01L 23/467 |
| | | | 361/697 |
| 2017/0094835 A1 | 3/2017 | Prather et al. | |
| 2017/0181316 A1 * | 6/2017 | Su | G06F 1/203 |
| 2017/0292537 A1 | 10/2017 | Barak | |
| 2017/0299276 A1 * | 10/2017 | Su | F28F 13/125 |
| 2018/0151468 A1 | 5/2018 | Axelrod et al. | |
| 2020/0025217 A1 * | 1/2020 | Lucas | H02K 33/06 |
| 2020/0037404 A1 | 1/2020 | Linares | |
| 2023/0012794 A1 * | 1/2023 | Ganti | H10N 30/306 |
| 2023/0049263 A1 * | 2/2023 | Lucas | H02K 1/141 |

* cited by examiner

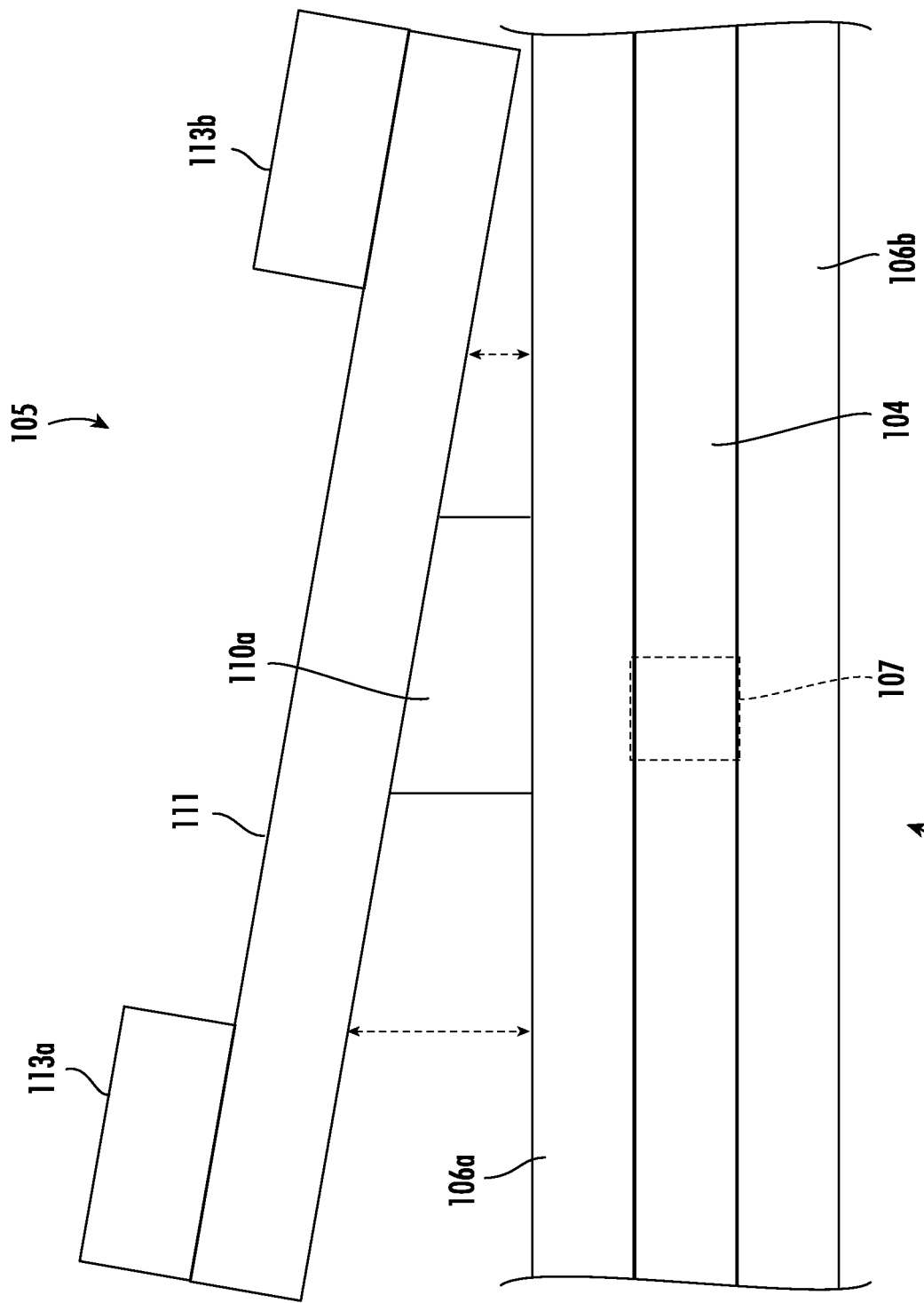

ELECTRONIC DEVICE AND COOLING DEVICE WITH FAN BLADE AND RELATED METHOD

TECHNICAL FIELD

The present disclosure relates to the field of electronic devices, and, more particularly, to thermal mitigation devices and related methods.

BACKGROUND

The electronic components of computers and other modern electronic devices are frequently mounted on a printed wiring board (PWB). The PWB and electronic components mounted thereon define a circuit card that can be inserted into a chassis and electronically coupled to a backplane of the electronic device. One circuit card may serve as a host card to another circuit card electrically and physically connected thereto. The circuit card connected to the host circuit card is typically carried in piggyback fashion above and parallel to the host circuit card and is conventionally referred to as a mezzanine circuit card.

As with electronic devices generally, operation of a circuit card can generate heat that, if not adequately controlled through some cooling mechanism, may cause damage to the electronic components carried on the circuit cards. One approach has been to use convection cooling techniques and devices. With convection cooling, the circuit cards may be mounted to a chassis in a way that permits cooling air to flow over the circuit cards.

For proper convection cooling, an adequate flow of cooling air should be generated. This may be done, for example, using a fan encased in the electronic device. The circuit cards, moreover, should be arranged so that a sufficient amount of the circuit card's surface area is exposed to the cooling air, and so that the cooling air flows relatively freely within the electronic device. Such arrangements may be incompatible, however, with some uses of circuit cards where electronic devices typically need to be quite small in size. Accordingly, there may not be space in such devices for a fan or to arrange the circuit cards so that air flows freely over them.

In one approach disclosed in U.S. Pat. No. 8,988,881 to Koplow, heat is transferred from a thermal load in thermal contact with a heat conducting structure, across a narrow air gap, to a rotating heat transfer structure immersed in a surrounding medium. The heat conducting structure may rotate at high speed and function as both a heat sink and a centrifugal pump.

SUMMARY

Generally, an electronic device may include an electronic circuit, a heat sink thermally coupled to the electronic circuit, and a plurality of spaced apart cooling fins extending from the heat sink. Each cooling fin may include a circuit board and at least one cooling device mounted thereon. The at least one cooling device may comprise a conductive trace layer on the circuit board defining at least one electromagnet, a mounting member extending upwardly from the circuit board, a fan blade coupled to an upper end of the mounting member to be movable in a rocking motion about an axis defined by the mounting member, and at least one permanent magnet carried by the fan blade and responsive to the at least one electromagnet.

More specifically, the conductive trace layer may comprise a plurality of spiral traces. The conductive trace layer may comprise first and second conductive trace layers on opposing major surfaces of the circuit board. The at least one cooling device may comprise a conductive via carried by the circuit board and coupling the first and second conductive trace layers.

In some embodiments, the mounting member may include spaced apart first and second mounting posts. The at least one permanent magnet may comprise first and second permanent magnets carried on opposite sides of the axis. The at least one cooling device may comprise at least one stop feature extending upwardly from the circuit board.

Also, the electronic device may include circuitry coupled to the at least one electromagnet and configured to generate sequential magnetic fields to alternatingly repel and attract the at least one permanent magnet. The circuitry may be configured to generate the sequential magnetic fields to rock the fan blade at a frequency between 2 and 100 Hz. For example, the mounting member may comprise a flexible dielectric material. The circuit board and the fan blade may each comprise a same dielectric material.

Another aspect is directed to a cooling device comprising a circuit board, and a conductive trace layer on the circuit board defining at least one electromagnet. The cooling device may comprise a mounting member extending upwardly from the circuit board, a fan blade coupled to an upper end of the mounting member to be movable in a rocking motion about an axis defined by the mounting member, and at least one permanent magnet carried by the fan blade and responsive to the at least one electromagnet.

Yet another aspect is directed to a method for making a cooling device comprising forming a conductive trace layer on a circuit board defining at least one electromagnet. The method may also include forming a mounting member extending upwardly from the circuit board, and forming a fan blade coupled to an upper end of the mounting member to be movable in a rocking motion about an axis defined by the mounting member. The method may further comprise mounting at least one permanent magnet carried by the fan blade and responsive to the at least one electromagnet.

Additionally, the forming of the conductive trace layer defining the at least one electromagnet may comprise selectively removing portions of a conductive layer from the circuit board. The forming of the mounting member may include depositing a dielectric mounting member layer and selectively removing portions thereof. The forming of the fan blade may comprise placing a dielectric fan blade layer on the mounting member layer prior to selectively removing portions of the dielectric mounting member layer.

BRIEF DESCRIPTION OF THE DRAWINGS

FIG. 2 is a schematic side view of a cooling device of the electronic device of FIGS. 1A & 1B with the fan blade in a rocking position.

DETAILED DESCRIPTION

Figure 1A:
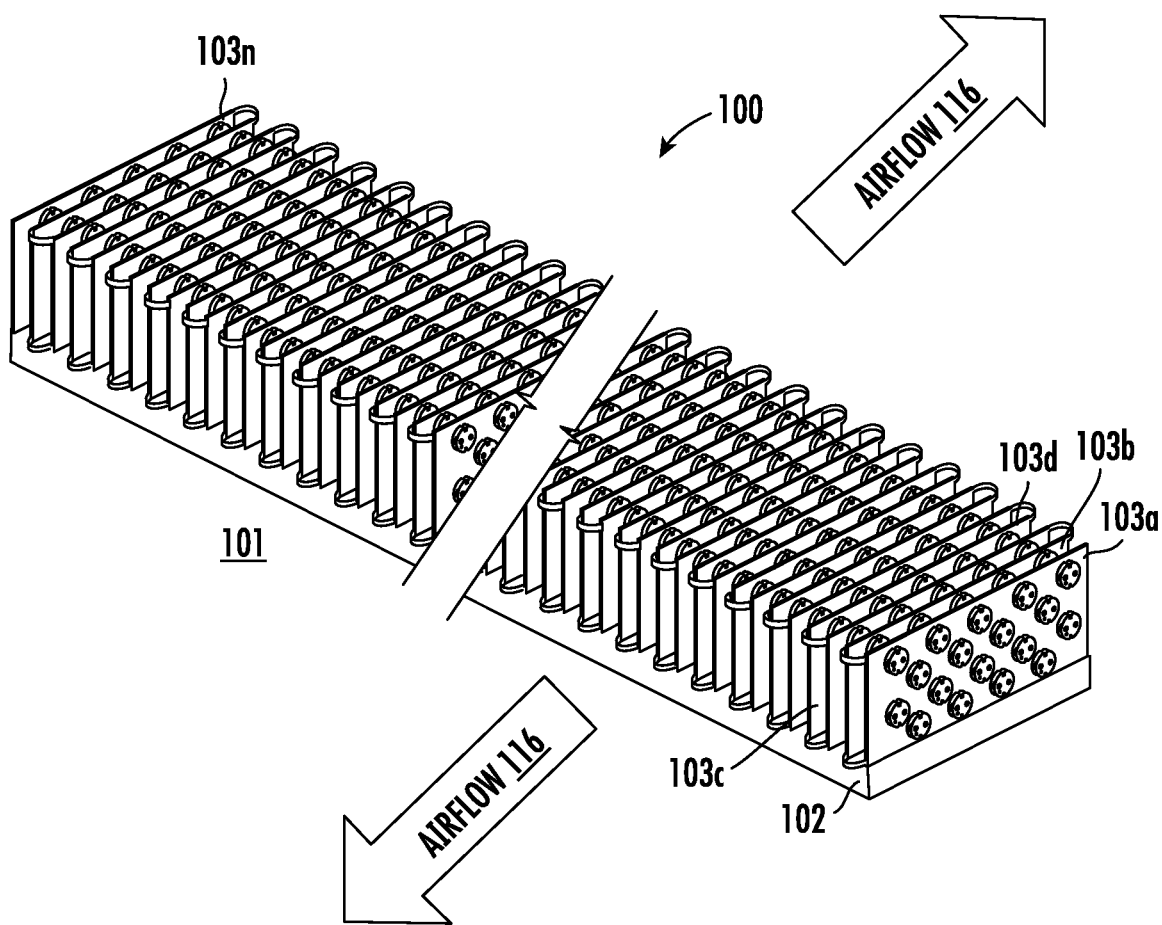
FIG. 1A is a schematic perspective view of an electronic device, according to the present disclosure.
Figure 1B:
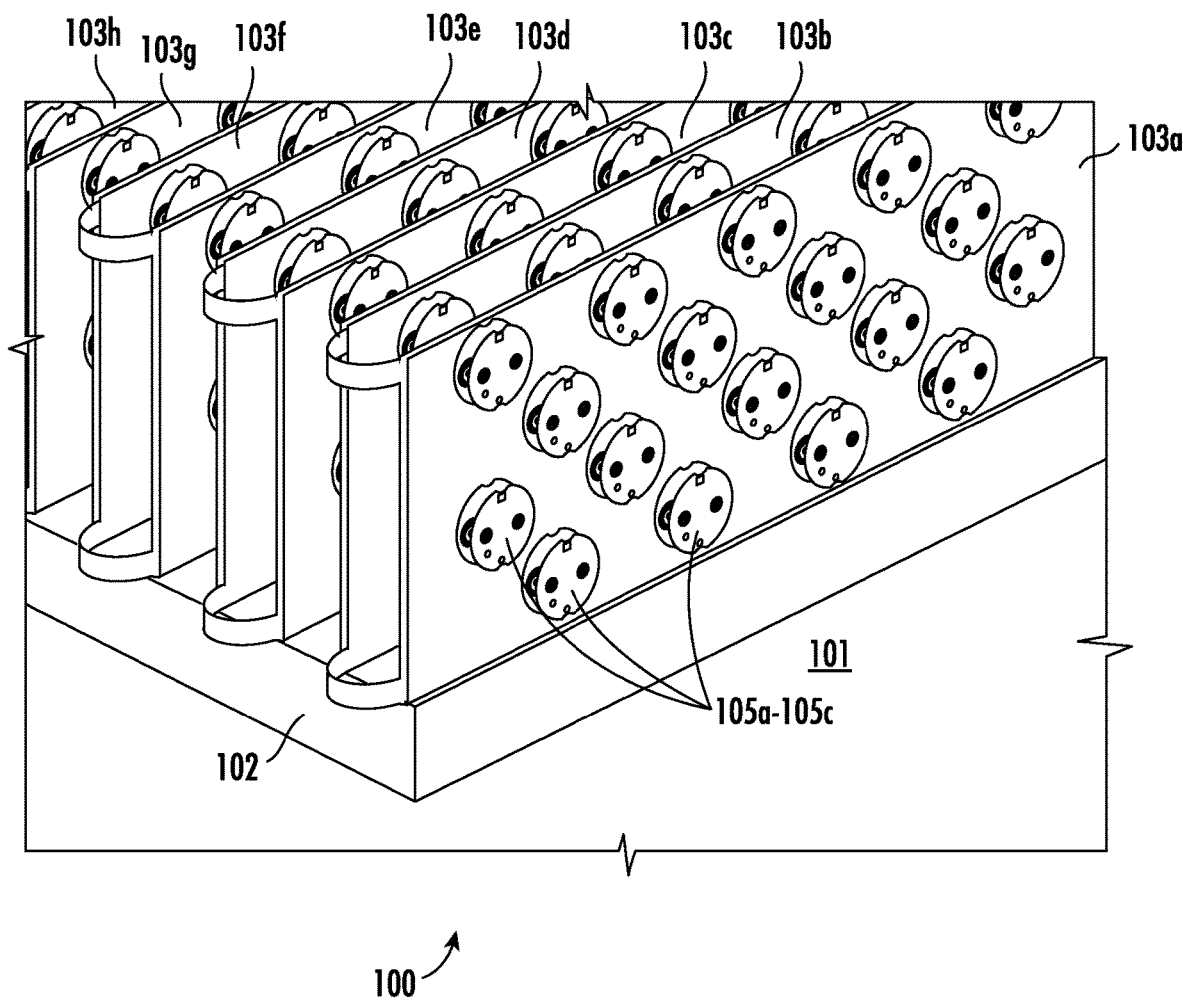
FIG. 1B is an enlarged schematic perspective view of the electronic device of FIG. 1A.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring initially to FIGS. 1A & 1B and 2-3, an electronic device 100 according to the present disclosure is now described. The electronic device 100 illustratively includes an electronic circuit 101 (e.g. radio frequency transceiver, processors, amplifiers, heat generating circuit components, etc.), a heat sink 102 thermally coupled to the electronic circuit, and a plurality of spaced apart cooling fins 103a-103n extending from the heat sink. The heat sink 102 may comprise a thermally conductive material, such as one or more of aluminum, and copper.

Each cooling fin 103a-103n illustratively comprises a circuit board 104, and a plurality of cooling devices 105a-105n mounted thereon. Of course, in some embodiments, each cooling fin 103a-103n may comprises a different number of cooling devices 105a-105n or a single cooling device. In the illustrated embodiment, the plurality of spaced apart cooling fins 103a-103n are daisy chained together to provide power to the plurality of cooling devices 105a-105n. In other embodiments, each of the plurality of spaced apart cooling fins 103a-103n may have a dedicated power connection.

Each cooling device 105a-105n illustratively includes first and second conductive trace layers 106a-106b on opposing major surfaces of the circuit board 104. The first and second conductive trace layers 106a-106b define an electromagnet. Each cooling device 105a-105n comprises a conductive via 107 carried by the circuit board 104 and coupling the first and second conductive trace layers 106a-106b.

Each cooling device 105a-105n illustratively includes a mounting member 110a-110b extending upwardly from the circuit board 104. In some embodiments (FIG. 12), the mounting member 110a-110b may comprise a single bar coupled to the circuit board. In the illustrated embodiment, the mounting member comprises spaced apart first and second mounting posts 110a-110b at opposite ends.

Each cooling device 105a-105n illustratively includes a fan blade 111 coupled to an upper end of the mounting member 110 to be movable in a rocking motion about an axis 112 defined by the mounting member. For example, the mounting member 110 may comprise a flexible dielectric material.

In the illustrated embodiment, the fan blade 111 is circle-shaped. In other embodiments, the fan blade 111 may have other shapes, such as, polygonal shapes and oval shapes. For example, the fan blade 111 may comprise a dielectric material. In some embodiments, the circuit board 104 and the fan blade 111 may each comprise a same dielectric material.

Each cooling device 105a-105n illustratively includes first and second permanent magnets 113a-113b carried by the fan blade 111 on opposite sides of the axis 112. The first and second permanent magnets 113a-113b are responsive to the electromagnet. In some embodiments, the first and second permanent magnets 113a-113b may comprise a single magnet at one of the ends of the fan blade 111.

Figure 3:
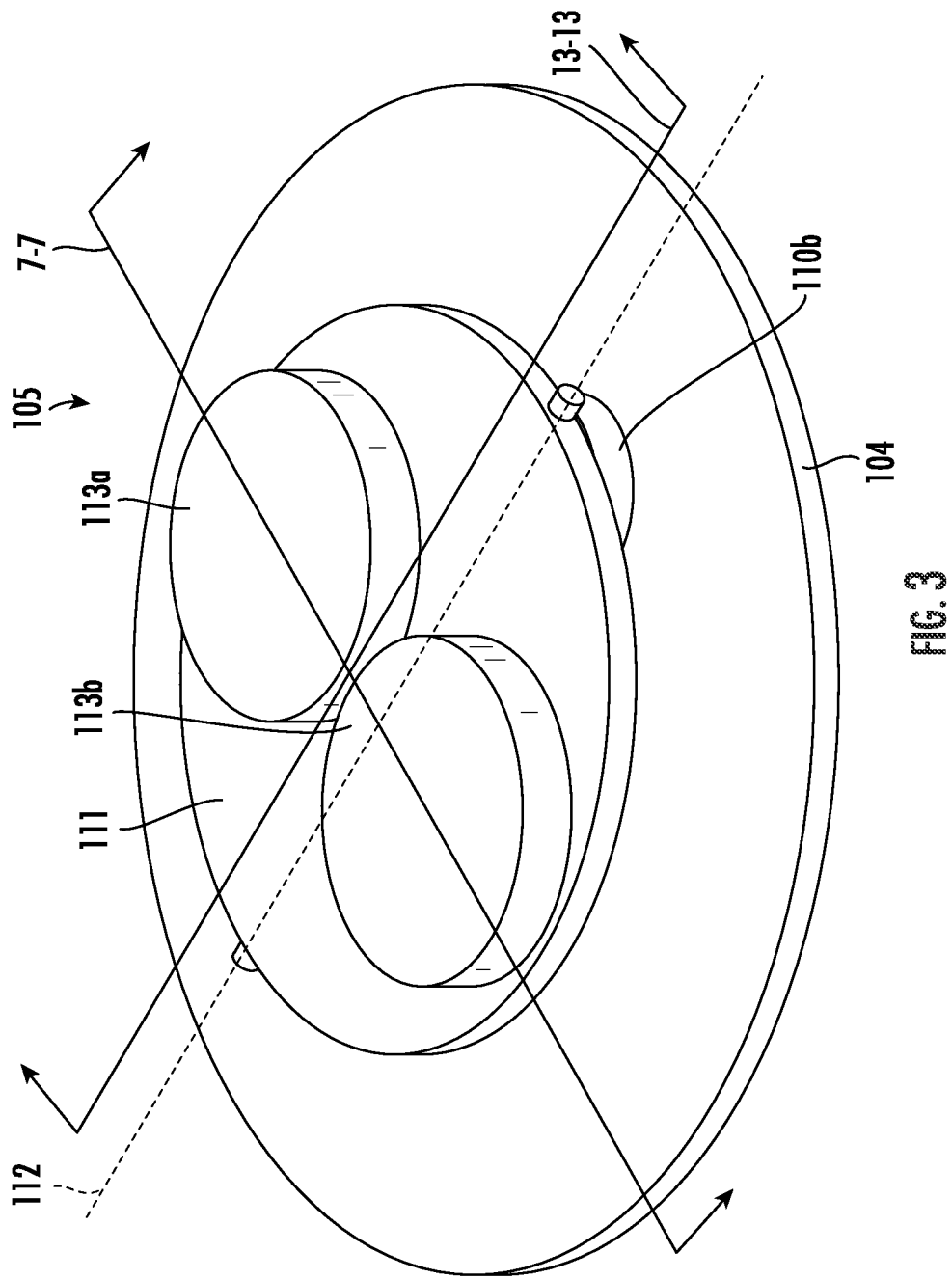
FIG. 3 is a schematic perspective view of the cooling device of the electronic device of FIGS. 1A & 1B without adjacent portions of the circuit board.
Figure 4A:
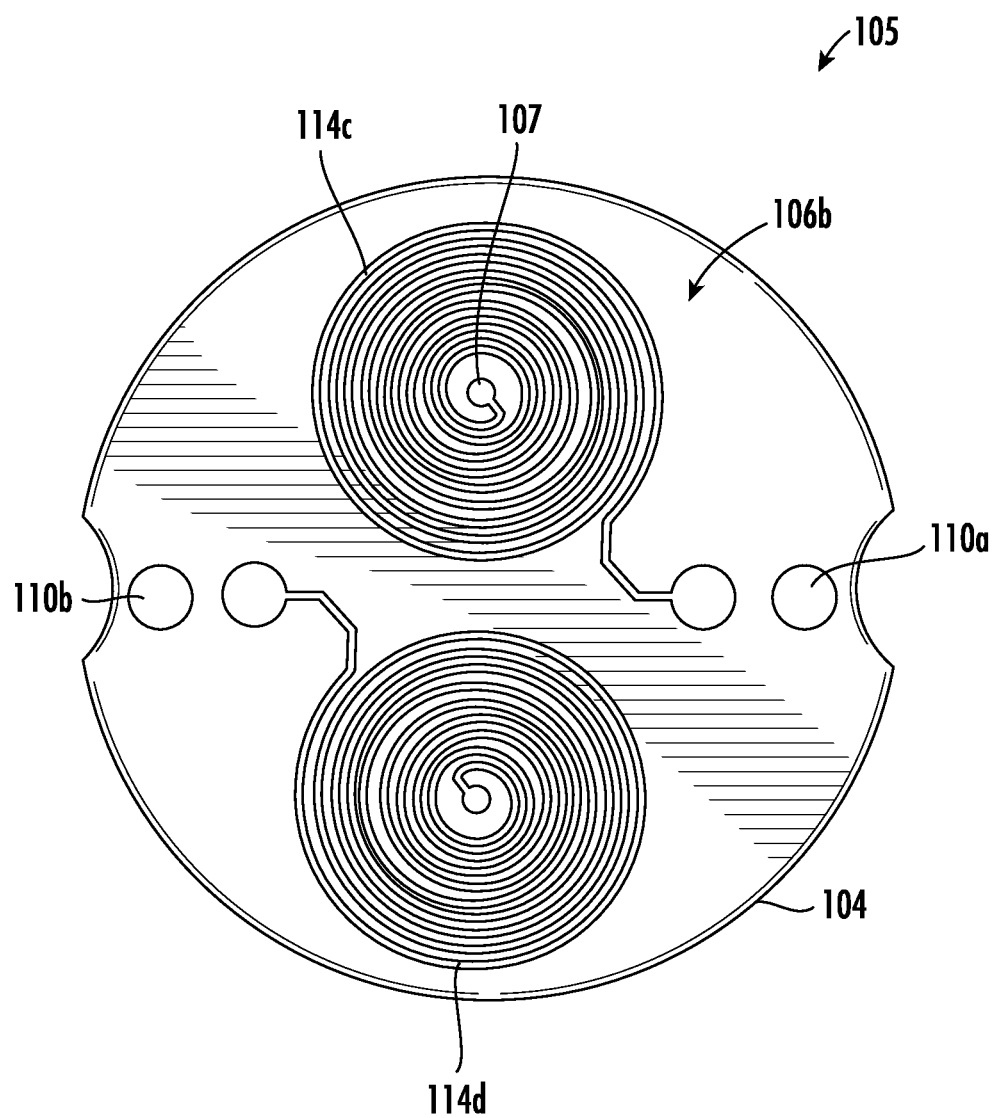
FIG. 4A is a schematic bottom view of the circuit board from the cooling device of FIG. 3.
Figure 4B:
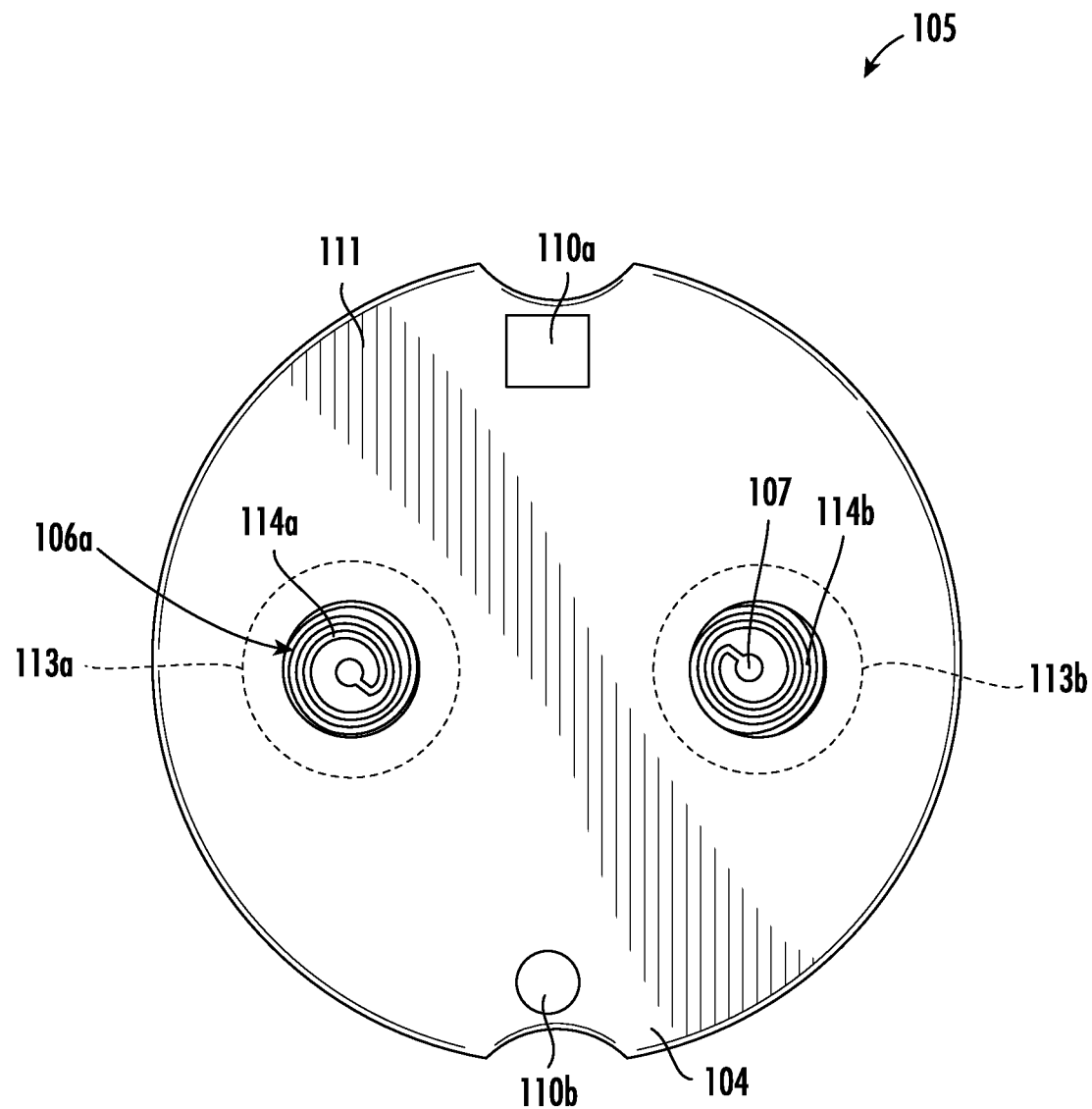
FIG. 4B is a schematic top view of the circuit board from the cooling device of FIG. 3.

Referring now to FIGS. 3 & 4A-4B, a single one 105 of the plurality of cooling devices 105a-105n is illustrated for drawing clarity. It should be appreciated that the circuit board 104 extends to the periphery of a respective cooling fin 103a-103n. Moreover, each of the plurality of cooling devices 105a-105n has a diameter that is less than 0.25 inches.

Each of the first and second conductive trace layers 106a-106b illustratively comprises a plurality of spiral traces 114a-114d. The electronic device 100 illustratively includes circuitry 115 coupled to the electromagnet and configured to generate sequential magnetic fields to alternatingly repel and attract the first and second permanent magnets 113a-113b, thereby rocking the fan blade 111 back and forth. The circuitry 115 may be configured to generate the sequential magnetic fields to rock the fan blade 111 at a frequency between 2-100 Hz, preferably in the range of 6 and 60 Hz.

As perhaps best seen in FIG. 1A, the collective rocking of the plurality of cooling devices 105a-105n creates lateral airflow 116. In combination with the typical convective airflow from the heat sink 102, which rises upward, this dissipates thermal energy from the plurality of spaced apart cooling fins 103a-103n. Moreover, as will be appreciated, the number and orientation of the plurality of spaced apart cooling fins 103a-103n and the plurality of cooling devices 105a-105n may be changed depending on the design needs of the application. For example, the plurality of cooling devices 105a-105n may be oriented to push airflow vertically rather than the illustrated lateral airflow.

Figure 5:
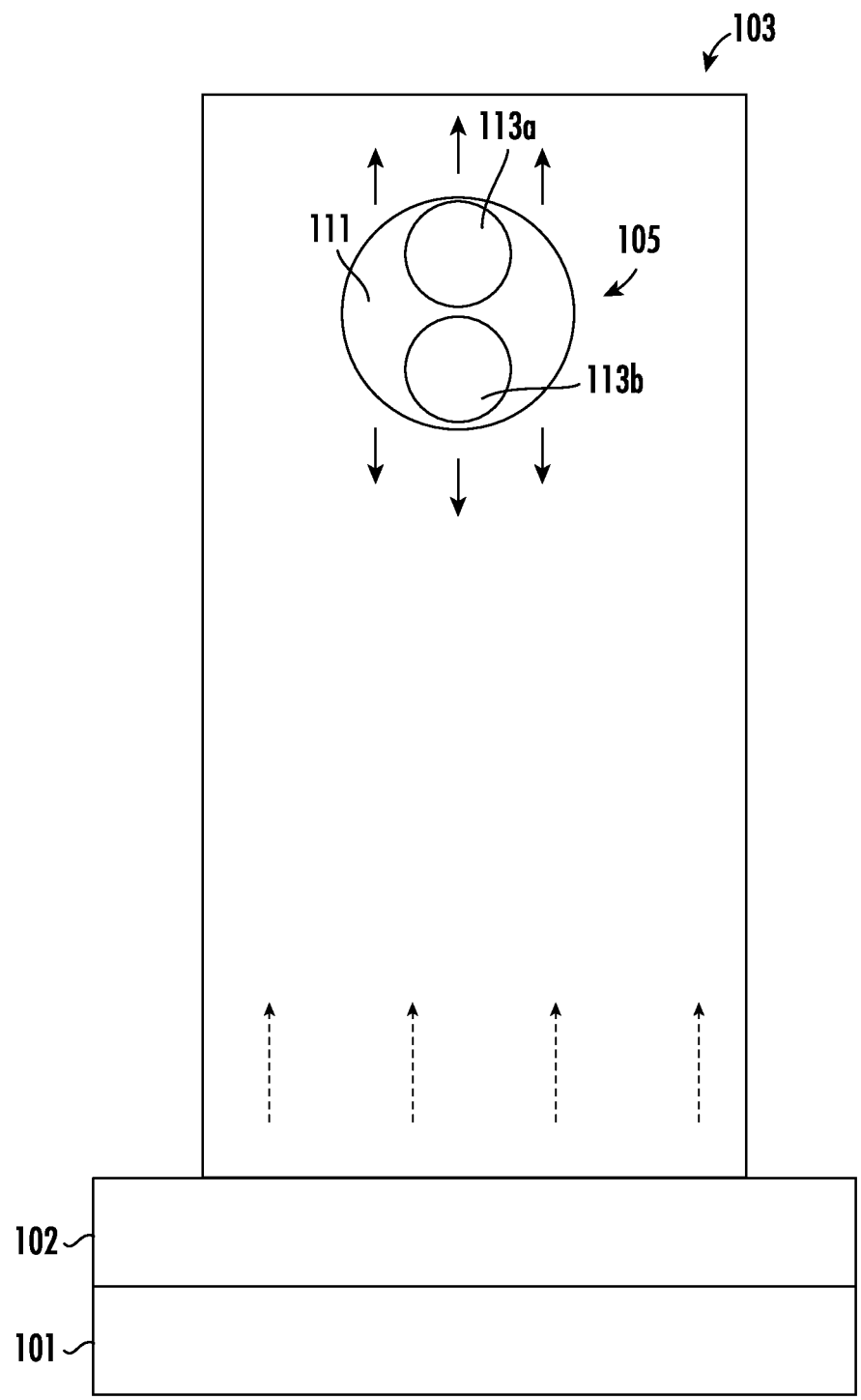
FIG. 5 is a schematic top view of a cooling fin from the electronic device of FIGS. 1A-1B.

Referring now additionally to FIG. 5, the cooling effects of the plurality of cooling devices 105a-105n are shown. For illustrative clarity, only one cooling device 105 is shown on a given cooling fin 103. As will be appreciated, the rocking fan blade 111 will illustratively push air sequentially up and down from the cooling device 105, which is shown with solid lines. Also, there is air flow upward from the heat sink 102, which is shown with dashed lines.

Figure 6A:
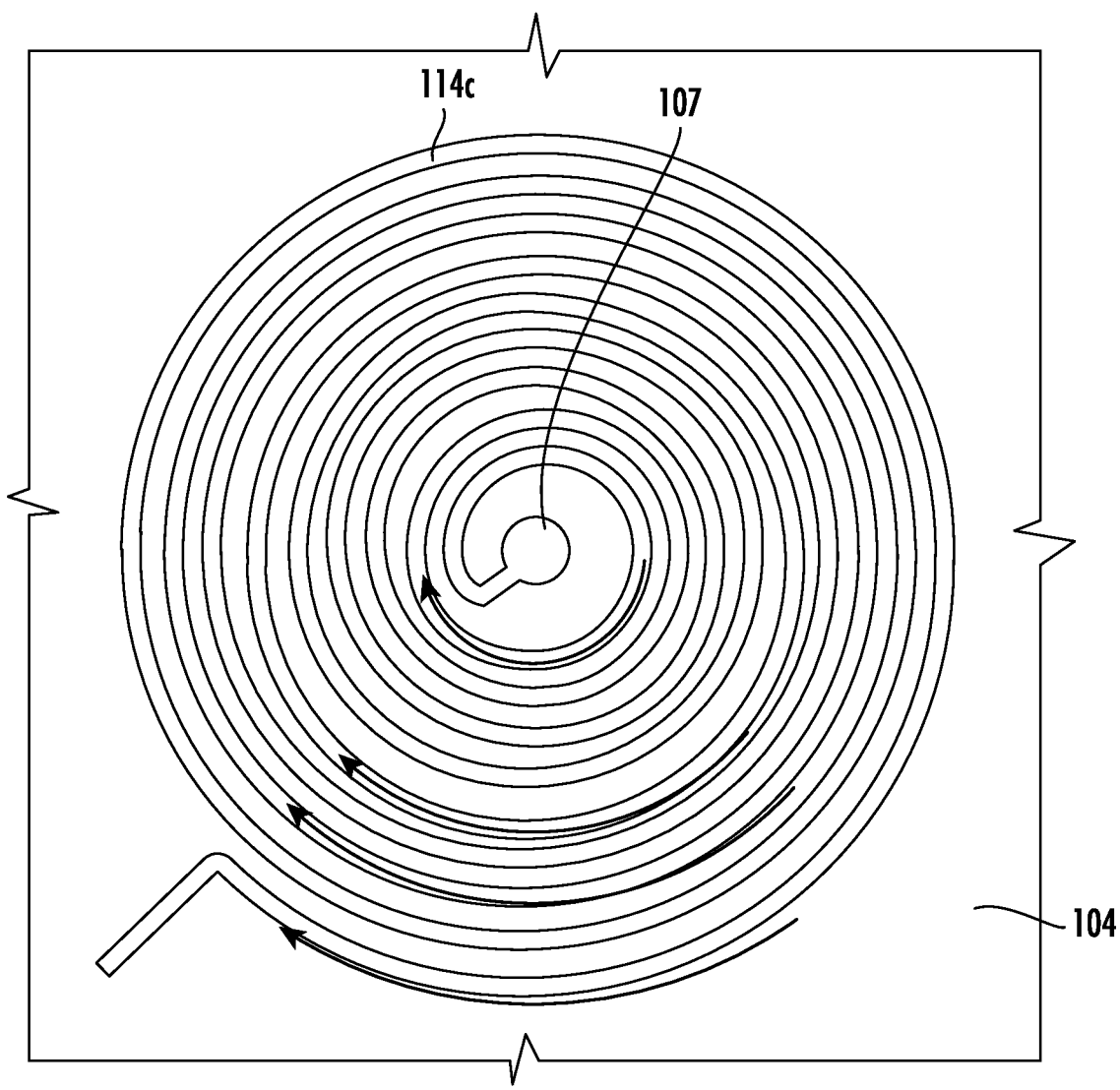
FIG. 6A is a schematic top view of a conductive trace layer from the circuit board from the cooling device of FIG. 3.
Figure 6B:
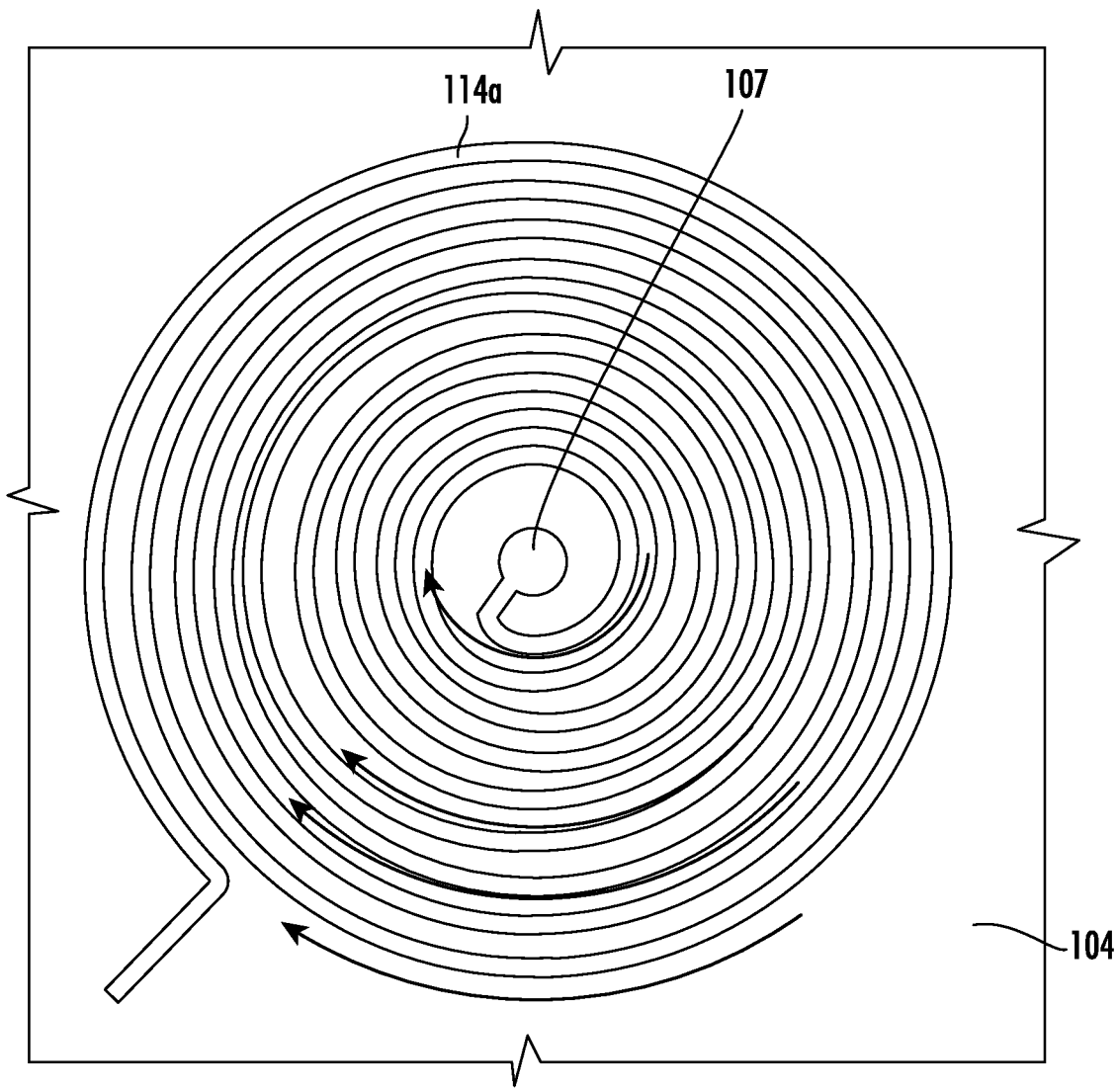
FIG. 6B is a schematic bottom view of a conductive trace layer from the circuit board from the cooling device of FIG. 3.
Figure 7:
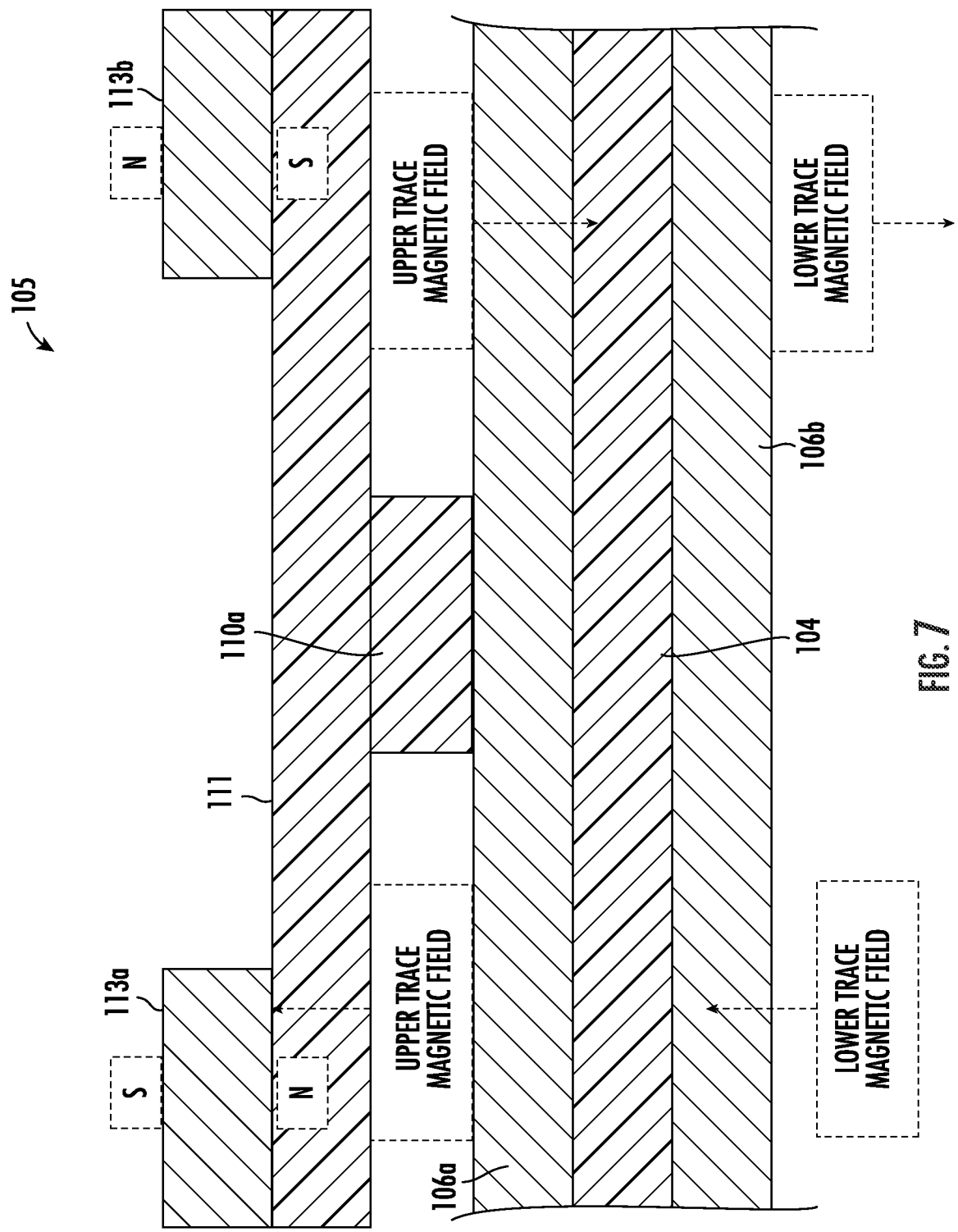
FIG. 7 is a schematic cross-sectional view of a cooling device of FIG. 3 along line 7-7 with magnetic fields noted and the fan blade at rest.

Referring now to FIGS. 6A-6B & 7, the plurality of spiral traces 114a-114d is shown. In particular, FIG. 6A shows the spiral traces 114a-114b on the first conductive trace layer 106a (i.e. the upper conductive trace layer). FIG. 6B shows the spiral traces 114c-114d on the second conductive trace layer 106b (i.e. the lower upper conductive trace layer). Here, the current direction is shown with solid line arrows. The conductive via 107 provides a connection between the vertically aligned spiral traces 114a-114d. In FIG. 6A, the magnetic field extends into the page, and in FIG. 6B, the magnetic field extends out of the page.

As shown in FIG. 7, the vertically aligned pairs of the plurality of spiral traces 114a-114d cooperate to repel the first permanent magnet 113a and attract the second permanent magnet 113b to cause the fan blade 111 to rock. Of course, the circuitry 115 is configured to selectively control the current flow through the aligned pairs of the plurality of spiral traces 114a-114d to sequential reverse the magnetic fields. In the illustrated embodiment, the pole orientation of the first and second permanent magnets 113a-113b is inverted with relation to each other. Of course, this orientation may be changed in cooperation with related changes to the operation of the circuitry 115.

Figure 8A:
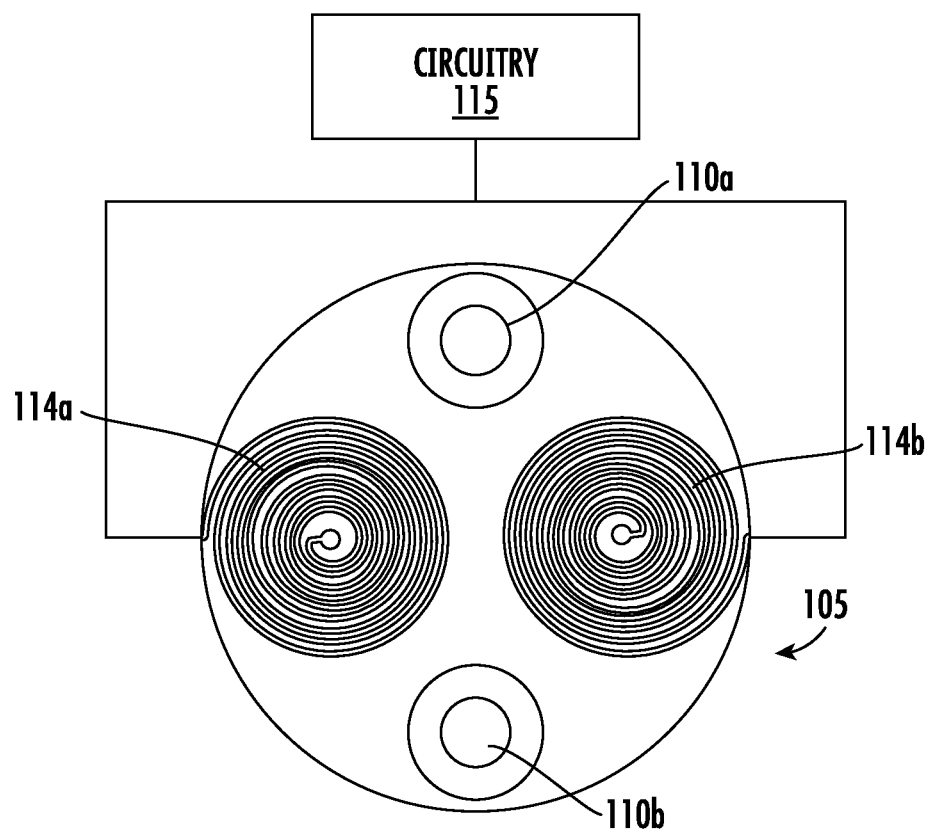
FIG. 8A is a schematic circuit diagram of an upper conductive trace of the cooling device of the electronic device of FIGS. 1A & 1B.
Figure 8B:
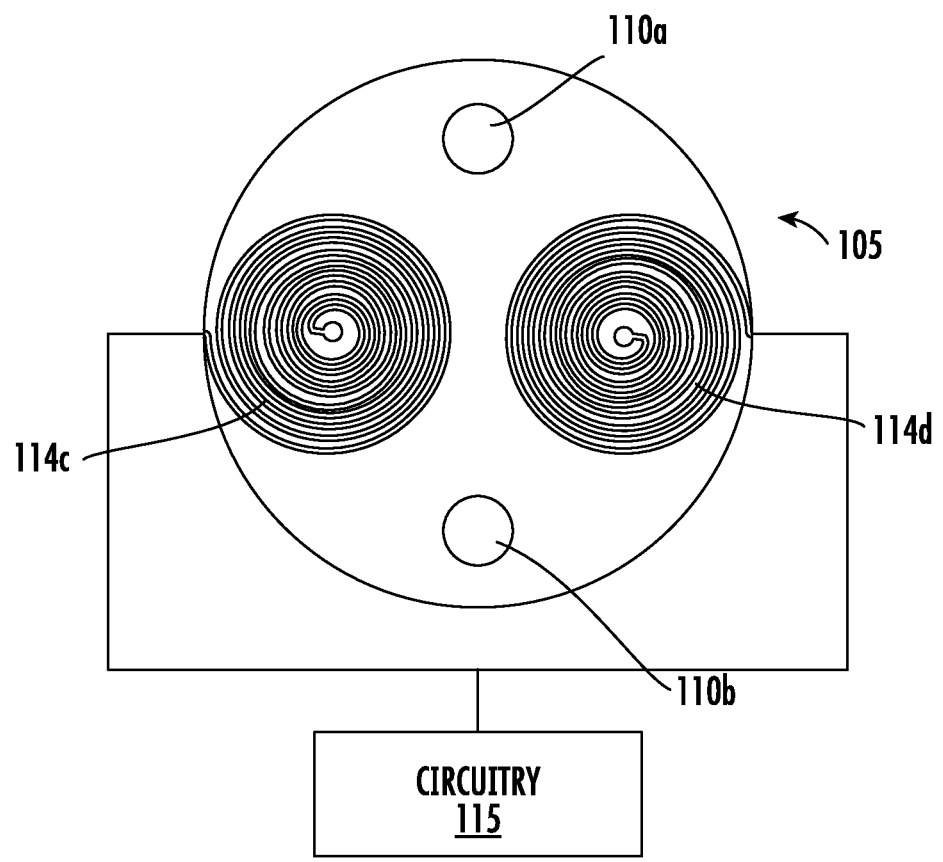
FIG. 8B is a schematic circuit diagram of a lower conductive trace of the cooling device of the electronic device of FIGS. 1A & 1B.
Figure 11:
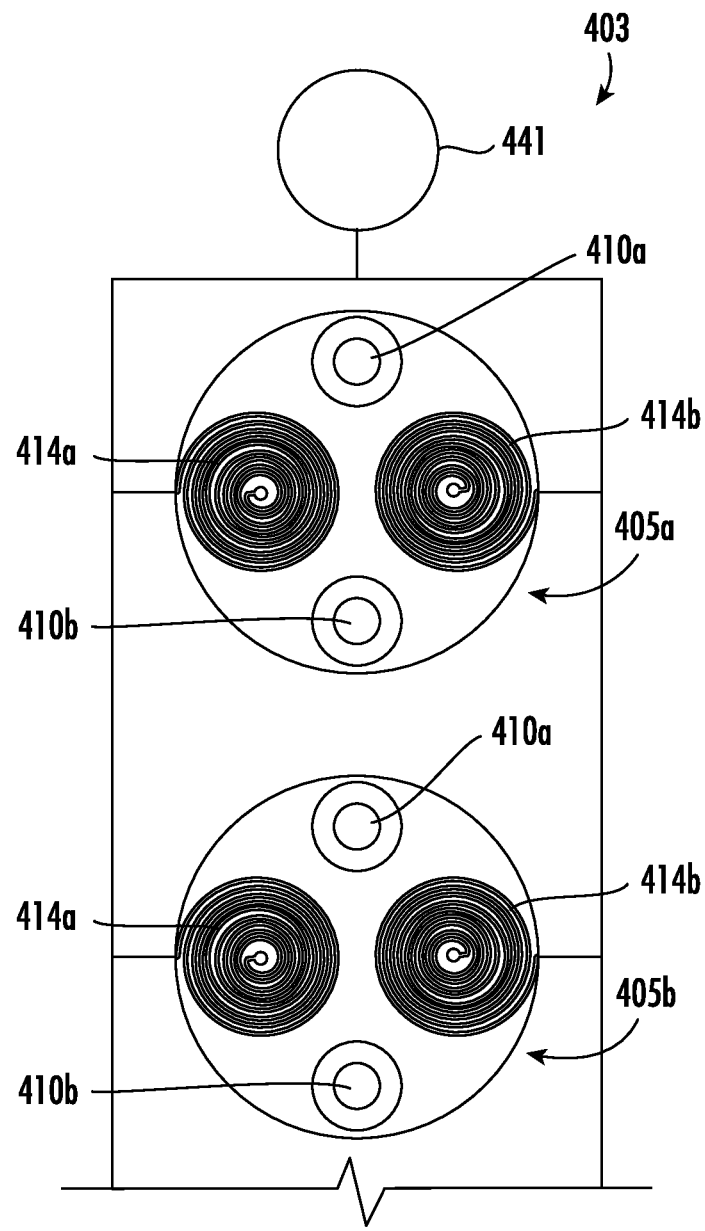
FIG. 11 is a schematic circuit diagram of the cooling devices of coupled in parallel, according to fourth embodiment of the present disclosure.

Referring now additionally to FIGS. 8A-8B, the circuitry 115 is coupled to distal ends of the plurality of spiral traces 114a-114d. Of course, in this illustrative example, the circuitry 115 is coupled to individually to each cooling device 105a-105n. The conductive traces for coupling the distal ends of the plurality of spiral traces 114a-114d may have a width in the range of 5-10 mils, for example. Here, in FIG. 8A, the circuitry 115 is configured to generate a current into the upper spiral traces 114a-114b, and in FIG. 8B, the current is output from the lower spiral traces 114c-114d. In other embodiments, the direct connection to the circuitry 115 may be replaced with a termination in conductive contact pads, such as shown in FIG. 11.

In the illustrated embodiment, the plurality of cooling devices 105a-105d is fabricated as integrated within the circuit board 104 of the plurality of spaced apart cooling fins 103a-103n. In other embodiments, the plurality of cooling devices 105a-105d may be separately manufactured and modularly mounted onto each of the plurality of spaced apart cooling fins 103a-103n.

In some embodiments, the circuitry 115 is configured to monitor a plurality of characteristics of the electronic circuit 101. For example, the plurality of characteristics may comprise an operating temperature of the electronic circuit 101, a current load of the electronic circuit, and an ambient temperature. The circuitry 115 is configured to selectively operate the plurality of cooling devices 105a-105d based upon the plurality of characteristics of the electronic circuit 101. For example, if the operating temperature is less than a threshold temperature, the circuitry 115 is configured to reduce an operating frequency of a subset of the plurality of cooling devices 105a-105d or disable the subset of the plurality of cooling devices 105a-105d. If the operating temperature is greater than the threshold temperature, the circuitry 115 is configured to increase the operating frequency of the plurality of cooling devices 105a-105d and enable any disabled cooling devices 105a-105d. Moreover, depending on the location of heat generating components, the circuitry 115 may adjust only the plurality of cooling devices 105a-105d carried by the respective adjacent cooling fin 103a-103n. In short, the circuitry 115 is configured to increase the operating frequency of cooling devices 105a-105d at the hot spot on the electronic circuit 101 rather than generally changing all the cooling devices.

Figure 9:
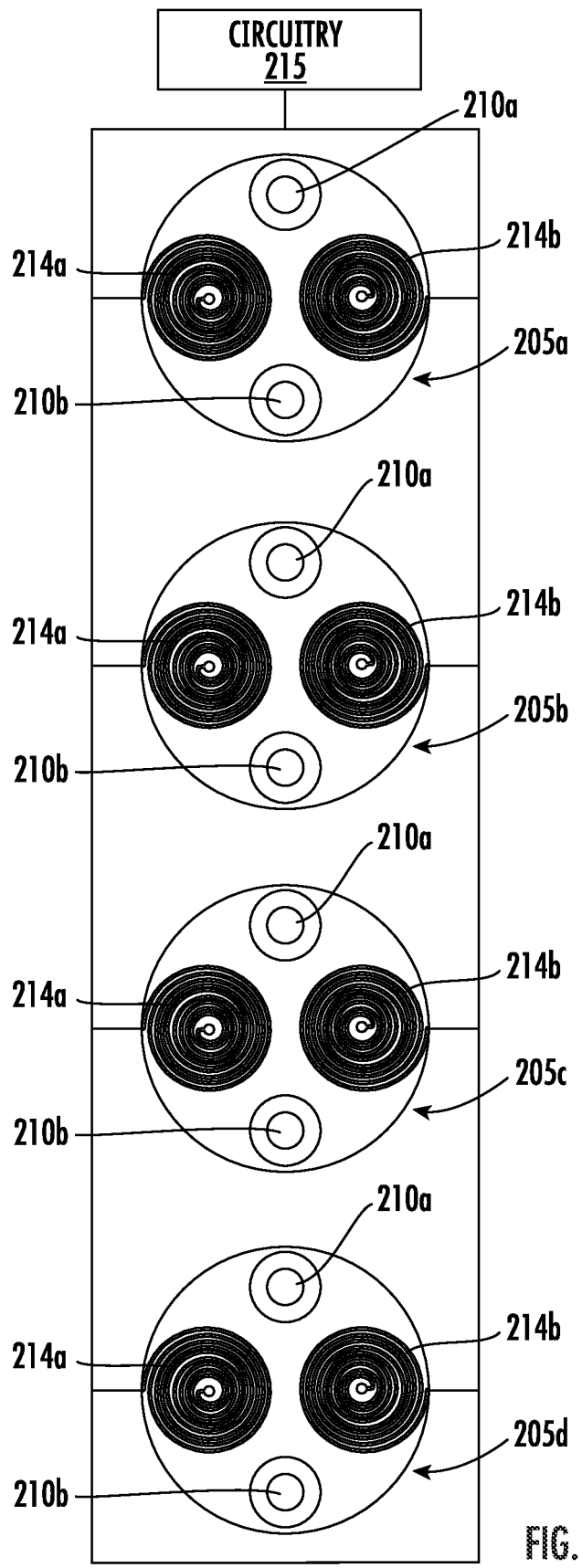
FIG. 9 is a schematic circuit diagram of the cooling devices of the electronic device of FIGS. 1A & 1B coupled in parallel, according to a second embodiment of the present disclosure.

Referring now additionally to FIG. 9, the circuitry 215 is coupled to distal ends of the plurality of spiral traces 214a-214d on a plurality of cooling devices 205a-205d. Here, the circuitry 215 is illustratively coupled the plurality of cooling devices 205a-205d in parallel fashion. Also, it should be appreciated the plurality of cooling devices 205a-205d are small in size. Indeed, the center to center spacing of the plurality of cooling devices 205a-205d in the illustrated example may be in the range of 0.25-0.55 inches.

Figure 10:
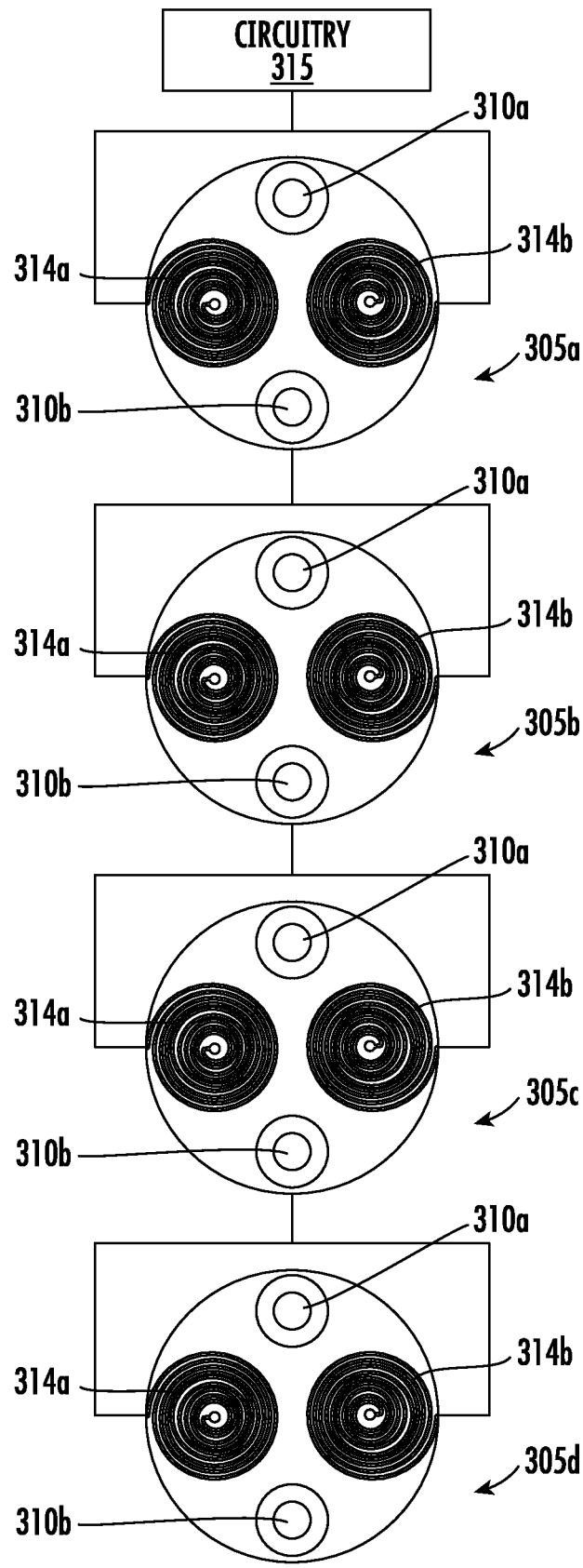
FIG. 10 is a schematic circuit diagram of the cooling devices of the electronic device of FIGS. 1A & 1B coupled in series, according to a third embodiment of the present disclosure.

Referring now additionally to FIG. 10, the circuitry 315 is coupled to distal ends of the plurality of spiral traces 314a-314d on a plurality of cooling devices 305a-305d. Here, the circuitry 315 is illustratively coupled the plurality of cooling devices 305a-305d in series fashion.

Referring now additionally to FIG. 11, the cooling fin 403 illustratively includes a conductive pad 441, which is coupled to distal ends of the plurality of spiral traces 414a-414d on a plurality of cooling devices 405a-405d. Here, the conductive pad 441 is illustratively coupled to the plurality of cooling devices 405a-405d in parallel fashion. Moreover, in this embodiment, the plurality of cooling devices 405a-405d may be coupled to an external power supply. For example, the power supply may comprise a 12 Volt power supply.

Figure 12:
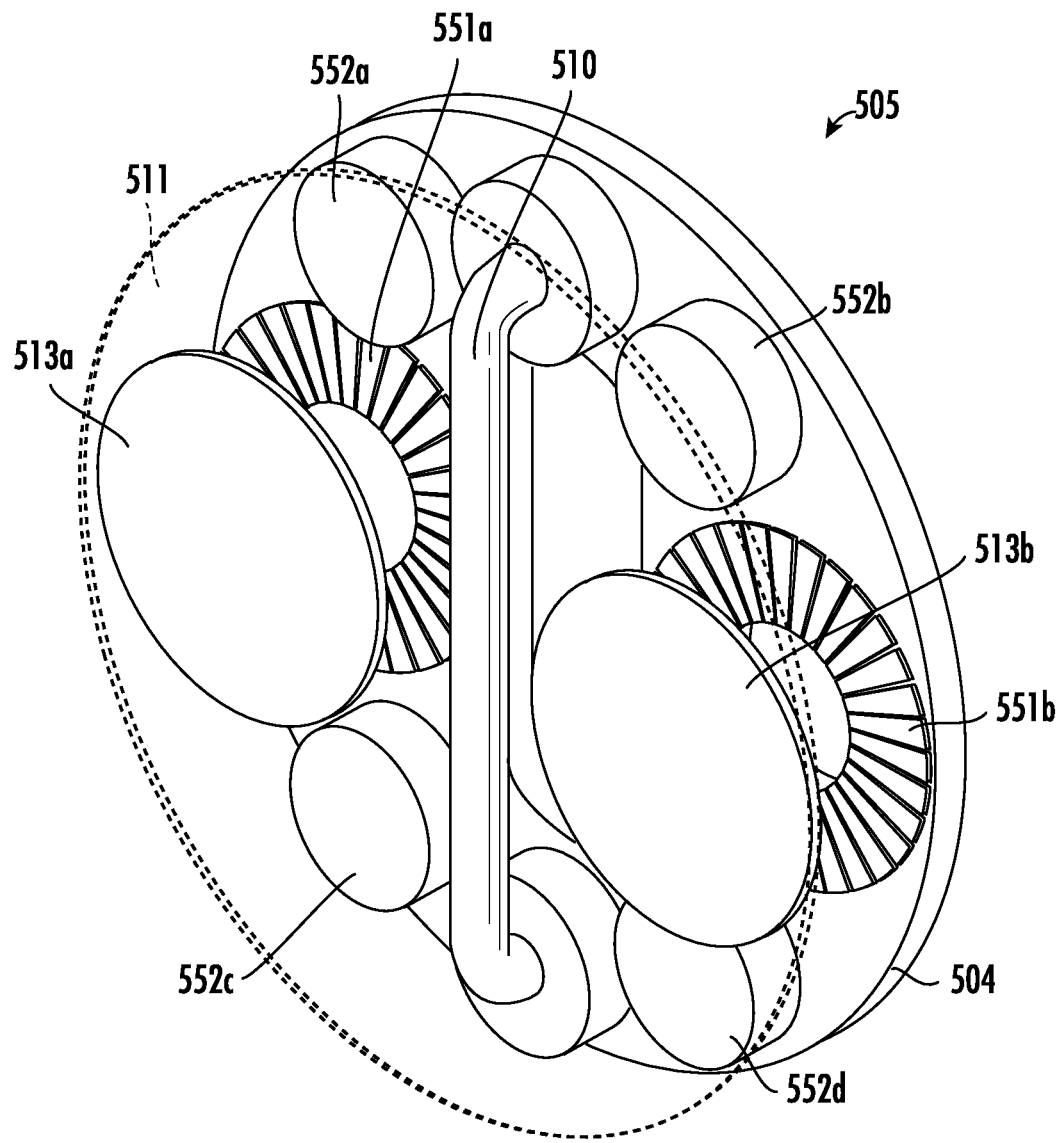
FIG. 12 is a schematic perspective view of a cooling device of the electronic device, according to a fifth embodiment of the present disclosure.

Referring now additionally to FIG. 12, another embodiment of the cooling device 505 is now described. In this embodiment of the cooling device 505, those elements already discussed above with respect to FIGS. 1-7 are incremented by 400 and most require no further discussion herein. This embodiment differs from the previous embodiment in that this cooling device 505 illustratively includes a plurality of conductive slats 551a-551b carried by the circuit board 504. Also, the cooling device 505 illustratively includes a plurality of stop features 552a-552d extending upwardly from the circuit board 504. Each of the plurality of stop features 552a-552d may comprise a flexible material (e.g. flexible dielectric material). As will be appreciated, the plurality of stop features 552a-552d may protect the circuit board 504 from damage from the fan blade 511. Here, the fan blade 511 is shown as transparent, noted with the dashed lines. Also, in this embodiment, the cooling device 505 illustratively includes a plurality of conductive slats 514a-514d rather than the spiral traces of prior embodiments. Also, in this embodiment, the cooling device 505 illustratively includes a single mounting member 510 rather than the multiple mounting posts of the prior embodiments. Similar to the prior embodiments, current is sent through the plurality of conductive slats 514a-514d (i.e. toroidal windings) to energize the circuit and induce near-uniform magnetic field to interact with the first and second permanent magnets 113a-113b.

Yet another aspect is directed to a method for making a cooling device 105a-105n comprising forming a conductive trace layer 106a-106b on a circuit board 104 defining at least one electromagnet. The method also includes forming a mounting member 110 extending upwardly from the circuit board 104, and forming a fan blade 111 coupled to an upper end of the mounting member to be movable in a rocking motion about an axis 112 defined by the mounting member. The method further comprises mounting at least one permanent magnet 113a-113b carried by the fan blade 111 and responsive to the at least one electromagnet. In some embodiments, the placement of the at least one permanent magnet 113a-113b may comprise using surface mounting technology, such as pick and place robots.

Additionally, the forming of the conductive trace layer 106a-106b defining the at least one electromagnet may comprise selectively removing portions (e.g. photoresist application step and etching step) of a conductive layer from the circuit board 104. The forming of the mounting member 110 may include depositing a dielectric mounting member layer and selectively removing portions (e.g. photoresist application step and etching step) thereof. The forming of the fan blade 111 may comprise placing a dielectric fan blade layer on the mounting member layer prior to selectively removing portions of the dielectric mounting member layer.

Helpfully, the plurality of cooling devices 105a-105n may be fabricated entirely with typical circuit board processing techniques. Indeed, the components of each of the plurality of cooling devices 105a-105n may comprise printed circuit board materials, such as dielectrics and conductive materials. Because of this, the manufacturing process may be easily scaled with a predictable yield.

In typical approaches to cooling, thermal management systems may either rely on high pressure forced convection for Air Flow Through (AFT) technologies, conventional fan technology, or liquid cooling. In AFT applications, high pressure air may be required, which terrestrial missions may not provide. Moreover, liquid cooling approaches may rely on pumps and a radiator assembly to absorb heat from electronics and reject it into the environment. In some approaches, two phase cooling with liquids may be used, but these approaches may require large amounts of fluid, room, and protective coatings on sensitive electronics.

Advantageously, the plurality of cooling devices 105a-105n may provide for enhanced thermal cooling performance. As will be appreciated, Size, Weight, Power (SWaP) is a concern for many applications, in particular, applications on mobile platforms. The plurality of cooling devices 105a-105n may provide a cooling approach that is small and weighs less. In particular, the plurality of cooling devices 105a-105n operate without a motor, and without liquid cooling.

Figure 13A:
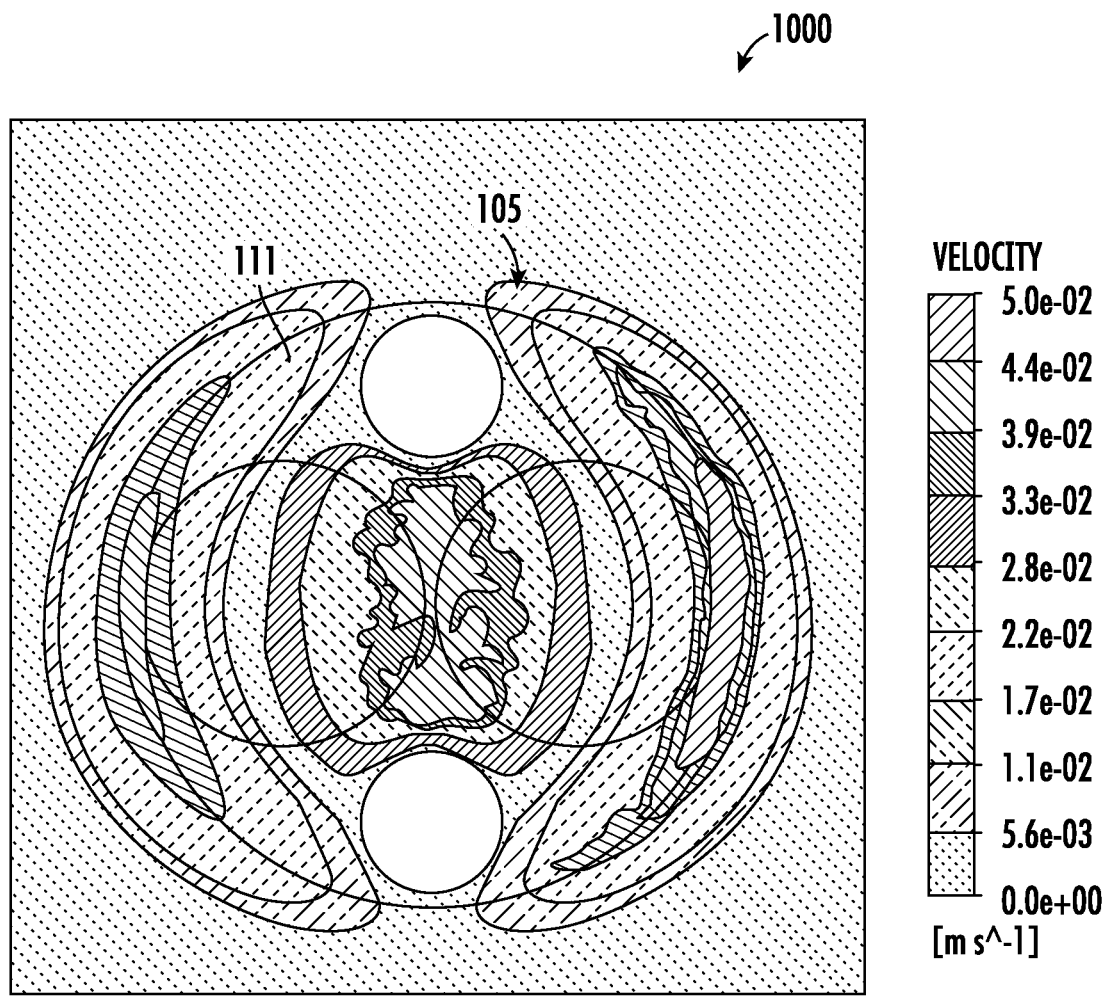
FIG. 13A is a top view thermal graph of the cooling device of FIG. 3 during operation.
Figure 13B:
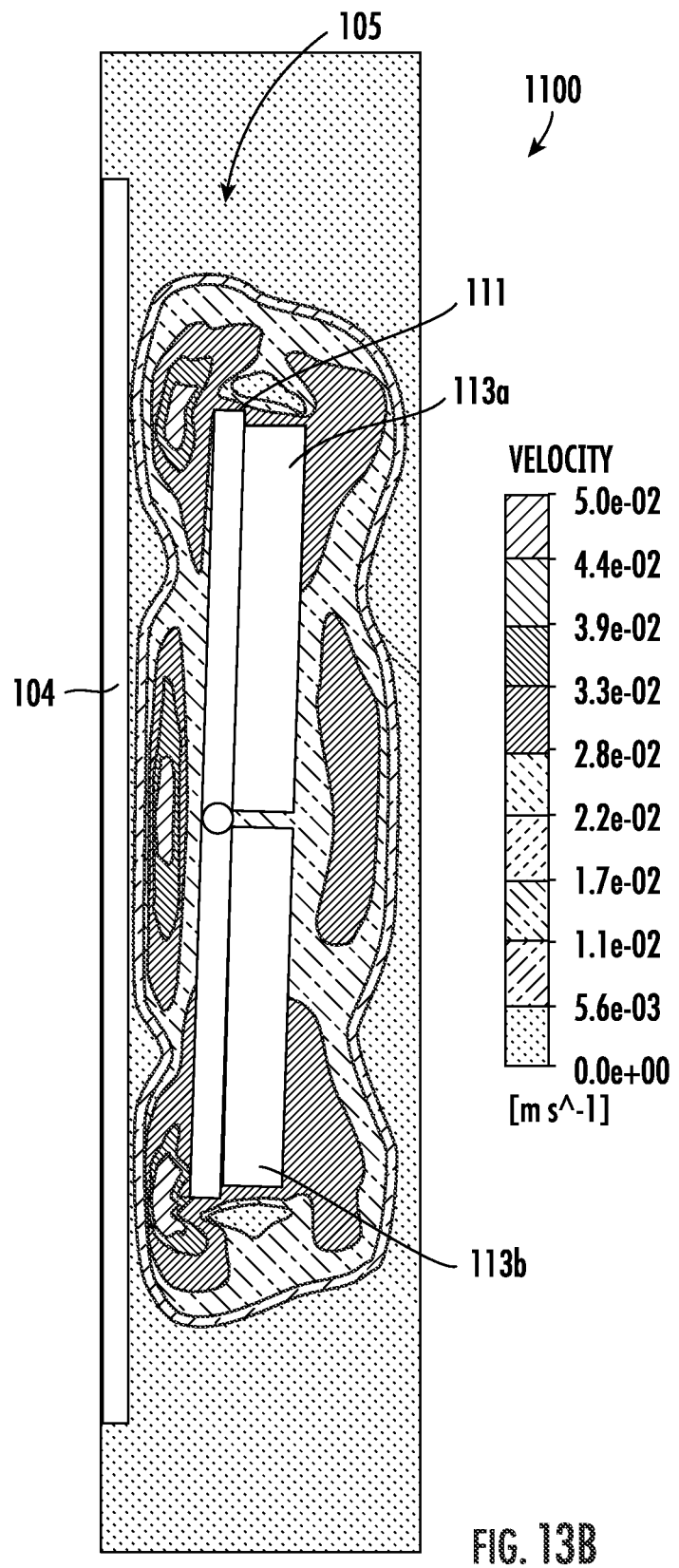
FIG. 13B is a side view thermal graph of the cooling device of FIG. 3 during operation.
Figure 13C:
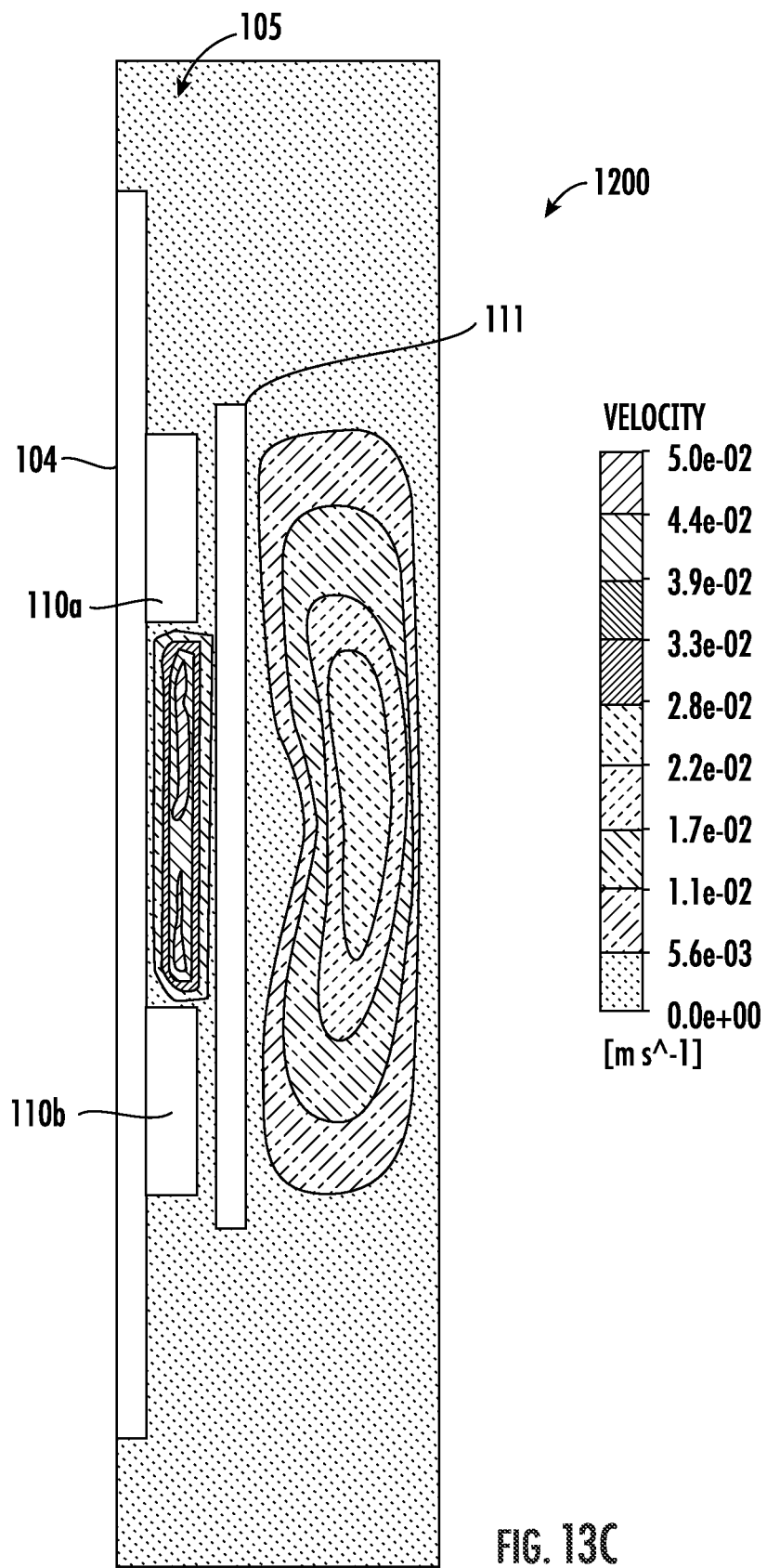
FIG. 13C is a sectional thermal graph of the cooling device of FIG. 3 during operation along line 13-13.

Referring now additionally to FIGS. 13A-13C, the power consumption of the plurality of cooling devices 105a-105n may be less than typical active cooling approaches. Also, the plurality of cooling devices 105a-105n may operate with less noise pollution than typical motorized fan approaches. For example, as shown in diagrams 1000, 1100, 1200 with a rocking frequency of 12 Hz, the plurality of cooling devices 105a-105n may provide a maximum airflow 116 greater than 0.069 m/s. In particular, the thermal graph in the diagram 1000 captures the moment of the fan blade 110 down stroke on the right side. Indeed, as shown in diagram 1100, the airflow is substantial even at the pivot point of the cooling device 105.

Positively, the plurality of cooling devices 105a-105n may provide greater thermal performance than traditional fins while eliminating need for external airflow. The surface mount plurality of cooling devices 105a-105n may provide modular, application specific, and scalable thermal management. The electromagnetically actuated plurality of cooling devices 105a-105n may reduce SWaP while combining traditional natural and forced convection.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. An electronic device comprising:
    an electronic circuit;
    a heat sink thermally coupled to the electronic circuit; and
    a plurality of spaced apart cooling fins extending from the heat sink, each cooling fin comprising a circuit board and at least one cooling device mounted thereon;
    the at least one cooling device comprising
        a conductive trace layer on the circuit board defining at least one electromagnet,
        a mounting member extending upwardly from the circuit board,
        a fan blade coupled to an upper end of the mounting member to be movable in a rocking motion about an axis defined by the mounting member, and
        at least one permanent magnet carried by the fan blade and responsive to the at least one electromagnet.

2. The electronic device of claim 1 wherein the conductive trace layer comprises a plurality of spiral traces.

3. The electronic device of claim 1 wherein the conductive trace layer comprises first and second conductive trace layers on opposing major surfaces of the circuit board.

4. The electronic device of claim 3 wherein the at least one cooling device comprises a conductive via carried by the circuit board and coupling the first and second conductive trace layers.

5. The electronic device of claim 1 wherein the mounting member comprises spaced apart first and second mounting posts.

6. The electronic device of claim 1 wherein the at least one permanent magnet comprises first and second permanent magnets carried on opposite sides of the axis.

7. The electronic device of claim 1 wherein the at least one cooling device comprises at least one stop feature extending upwardly from the circuit board.

8. The electronic device of claim 1 comprising circuitry coupled to the at least one electromagnet and configured to generate sequential magnetic fields to alternatingly repel and attract the at least one permanent magnet.

9. The electronic device of claim 8 wherein the circuitry is configured to generate the sequential magnetic fields to rock the fan blade at a frequency between 2 and 100 Hz.

10. The electronic device of claim 1 wherein the mounting member comprises a flexible dielectric material.

11. The electronic device of claim 1 wherein the circuit board and the fan blade each comprises a same dielectric material.

12. A cooling device comprising:
    a circuit board;
    a conductive trace layer on the circuit board defining at least one electromagnet;
    a mounting member extending upwardly from the circuit board;
    a fan blade coupled to an upper end of the mounting member to be movable in a rocking motion about an axis defined by the mounting member; and at least one permanent magnet carried by the fan blade and responsive to the at least one electromagnet.

13. The cooling device of claim 12 wherein the conductive trace layer comprises a plurality of spiral traces.

14. The cooling device of claim 12 wherein the conductive trace layer comprises first and second conductive trace layers on opposing major surfaces of the circuit board.

15. The cooling device of claim 14 comprising a conductive via carried by the circuit board and coupling the first and second conductive trace layers.

16. The cooling device of claim 12 wherein the mounting member comprises spaced apart first and second mounting posts.

17. The cooling device of claim 12 wherein the at least one permanent magnet comprises first and second permanent magnets carried on opposite sides of the axis.

18. The cooling device of claim 12 comprising at least one stop feature extending upwardly from the circuit board.

19. The cooling device of claim 12 wherein the mounting member comprises a flexible dielectric material.

20. The cooling device of claim 12 wherein the circuit board and the fan blade each comprises a same dielectric material.

21. A method for making a cooling device comprising:
forming a conductive trace layer on a circuit board defining at least one electromagnet;
forming a mounting member extending upwardly from the circuit board;
forming a fan blade coupled to an upper end of the mounting member to be movable in a rocking motion about an axis defined by the mounting member; and
mounting at least one permanent magnet carried by the fan blade and responsive to the at least one electromagnet.

22. The method of claim 21 wherein forming the conductive trace layer defining the at least one electromagnet comprises selectively removing portions of a conductive layer from the circuit board.

23. The method of claim 21 wherein forming the mounting member comprises depositing a dielectric mounting member layer and selectively removing portions thereof.

24. The method of claim 23 wherein forming the fan blade comprises placing a dielectric fan blade layer on the mounting member layer prior to selectively removing portions of the dielectric mounting member layer.

25. The method of claim 21 wherein the conductive trace layer comprises a plurality of spiral traces.

26. The method of claim 21 wherein the mounting member comprises spaced apart first and second mounting posts.

27. The method of claim 21 wherein the at least one permanent magnet comprises first and second permanent magnets carried on opposite sides of the axis.

28. The method of claim 21 comprising forming at least one stop feature extending upwardly from the circuit board.

29. The method of claim 21 wherein the mounting member comprises a flexible dielectric material.

30. The method of claim 21 wherein the circuit board and the fan blade each comprises a same dielectric material.

* * * * *